United States Patent [19]
Pedersen

[11] Patent Number: 5,565,793
[45] Date of Patent: Oct. 15, 1996

[54] PROGRAMMABLE LOGIC ARRAY INTEGRATED CIRCUIT DEVICES WITH REGIONS OF ENHANCED INTERCONNECTIVITY

[75] Inventor: Bruce B. Pedersen, San Jose, Calif.

[73] Assignee: Altera Corporation, San Jose, Calif.

[21] Appl. No.: 517,596

[22] Filed: Aug. 22, 1995

[51] Int. Cl.$^6$ ............................................. H03K 19/177
[52] U.S. Cl. ............................................................. 326/41
[58] Field of Search ............................................... 326/41

[56] References Cited

U.S. PATENT DOCUMENTS

| | | | |
|---|---|---|---|
| Re. 34,363 | 8/1993 | Freeman | 307/465 |
| 3,473,160 | 10/1969 | Wahlstrom | 340/172.5 |
| 4,609,986 | 9/1986 | Hartmann et al. | 364/200 |
| 4,617,479 | 10/1986 | Hartmann et al. | 307/465 |
| 4,642,487 | 2/1987 | Carter | 307/465 |
| 4,677,318 | 6/1987 | Veenstra | 307/465 |
| 4,713,792 | 12/1987 | Hartmann et al. | 364/900 |
| 4,758,745 | 7/1988 | Elgamal et al. | 307/465 |
| 4,774,421 | 9/1988 | Hartmann et al. | 307/465 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 5,121,006 | 6/1992 | Pedersen | 307/465 |
| 5,220,214 | 6/1993 | Pedersen | 307/465 |
| 5,258,668 | 11/1993 | Cliff et al. | 307/465 |
| 5,260,610 | 11/1993 | Pedersen et al. | 307/465 |
| 5,260,611 | 11/1993 | Cliff et al. | 307/465 |
| 5,274,581 | 12/1993 | Cliff et al. | 364/784 |
| 5,350,954 | 9/1994 | Patel | 307/465 |
| 5,371,422 | 12/1994 | Patel et al. | 326/41 |
| 5,455,525 | 10/1995 | Ho et al. | 326/41 |
| 5,485,103 | 1/1996 | Pedersen et al. | 326/41 |

OTHER PUBLICATIONS

R. C. Minnick, "A Survey of Microcellular Research," Journal of the Association for Computing Machinery, vol. 14, No. 2, pp. 203–41, Apr. 1967.
S. E. Wahlstrom, "Programmable Logic Arrays—Cheaper by the Millions," Electronics, Dec. 11, 1967, pp. 90–95.
*Recent Developments in Switching Theory*, A. Mukhopadhyay, ed., Academic Press, New York, 1971, chapters VI and IX, pp. 229–254 and 369–422.
El Gamal et al., "An Architecture for Electrically Configurable Gate Arrays," IEEE Journal of Solid–State Circuits, vol. 24, No. 2, Apr. 1989, pp. 394–98.
El-Ayat et al., "A CMOS Electrically Configurable Gate Array," IEEE Journal of Solid–State Circuits, vol. 24, No. 3, Jun. 1989, pp. 752–62.
"XC5000 Logic Cell Array Family, Technical Data, Advance Information," Xilinx, Inc., Feb. 1995.

*Primary Examiner*—Edward P. Westin
*Assistant Examiner*—Richard Roseen
*Attorney, Agent, or Firm*—Fish & Neave; Robert R. Jackson

[57] ABSTRACT

A programmable logic array integrated circuit device which includes a plurality of regions of programmable logic and interconnection resources for selectively conveying logic signals between various ones of said regions has at least one portion of its interconnection resources enhanced or augmented relative to other similar portions. Any portions of a user's logic that requires more than a usual amount of interconnectivity can be placed in the portion of the device which has the augmented interconnection resources. Examples of augmented interconnection resources are extra conductors for conveying logic signals along one or more rows and/or one or more columns of logic regions on the device.

26 Claims, 4 Drawing Sheets

PROGRAMMABLE LOGIC ARRAY INTEGRATED CIRCUIT DEVICES WITH REGIONS OF ENHANCED INTERCONNECTIVITY

BACKGROUND OF THE INVENTION

This invention relates to programmable logic array integrated circuit devices, and more particularly to programmable logic array integrated circuit devices in which some portions of the device are provided with substantially more interconnection resources than other portions of the device are provided with.

A typical programmable logic array integrated circuit device has a plurality of regions of programmable logic disposed on the device in a two-dimensional array of intersecting rows and columns of such regions. Each region is programmable to perform any one or more of several logic functions on plural input signals applied to that region. Each region produces one or more output signals indicative of the results of the logic function(s) performed by that region. Programmable interconnection resources are provided on the device for such purposes as bringing input signals to each logic region and conveying output signals from the logic regions. These interconnection resources also bring input signals into the logic of the device from external circuitry and convey output signals from the logic of the device to that external circuitry. The interconnection resources include programmable switches for allowing many different signal routings throughout the device.

The above-described devices are typically intended as general-purpose devices. Thus the designer of a device does not know all the uses to which purchasers ("users") of the device may want to put it. Despite this lack of specific knowledge, however, the designer's objective is generally to provide a design which will satisfy the greatest number of reasonably possible uses. This typically means supplying both the largest amount of logic, and also supplying sufficient interconnection resources so that any desired interconnections can be made without other necessary interconnections being blocked or the interconnection resources being exhausted. These two objectives are somewhat conflicting, of course, because space on the device that is devoted to interconnection resources is not available for logic and vice versa. Also, as the amount of logic increases, the number of possible interconnections tends to increase at least geometrically and perhaps exponentially. On the other hand, most uses of the device will not require use of anywhere near all of the theoretically possible interconnections. Providing completely general interconnection resources would also tend to unduly load the circuitry, thereby increasing the power required to drive it and/or slowing it down. Thus, for reasons of practicality, economy, speed, etc., the designer is obliged to select from completely general interconnection resources a subset of those resources which will be sufficient in the largest reasonably possible number of probable uses of the device without providing substantially more than that amount of such resources. This is an extremely difficult aspect of device design, and many different approaches have been taken to it.

The present inventor has observed that although prior art programmable logic array integrated circuit devices tend to have interconnection resources that are distributed substantially uniformly throughout the device, most uses of the device involve some logic portions that require substantially more interconnection resources than other logic portions.

In view of the foregoing, it is an object of this invention to provide programmable logic array integrated circuit devices with available interconnection resources that more closely match the requirements for such resources of the typical user logic those devices are used to implement.

It is a more particular object of this invention to provide programmable logic array integrated circuit devices with interconnection resources that are more efficiently distributed, for example, to better match the typical distribution of the need for such resources in the user logic typically implemented by those devices.

SUMMARY OF THE INVENTION

These and other objects of the invention are accomplished in accordance with the principles of the invention by providing programmable logic array integrated circuit devices in which certain regions of the programmable logic on the device are served by more interconnection resources than other regions are served by. For example, in a device having several rows and columns of logic regions, one or more rows may have substantially more interconnection conductors extending along that row or those rows than other rows in the device have. Any portion of the user logic which requires more interconnection resources of this kind is then placed in the row or rows with more row conductors. Providing one or more rows with increased numbers of row conductors may allow the device to satisfy more user logic requirements than it otherwise could, or it may permit the designer to reduce the number of row conductors in other rows without significant loss of usability of the device.

As another example of application of the principles of this invention, in some programmable logic array device architectures logic region feeding conductors are used to selectively bring signals to each logic region from longer conductors that pass by several regions. For example, these logic region feeding conductors may bring signals to each logic region from conductors such as the row conductors mentioned above. In accordance with this invention some regions may be provided with more of these region feeding conductors than other regions are provided with. Any portions of the user logic that require more than the typical number of region feeding conductors are then placed in the regions that have increased numbers of such conductors. Again, the provision of some logic regions with more region feeding conductors may allow the device to satisfy more user demands, or it may allow the number of region feeding conductors associated with other regions to be reduced without significant loss in the usability of the device.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
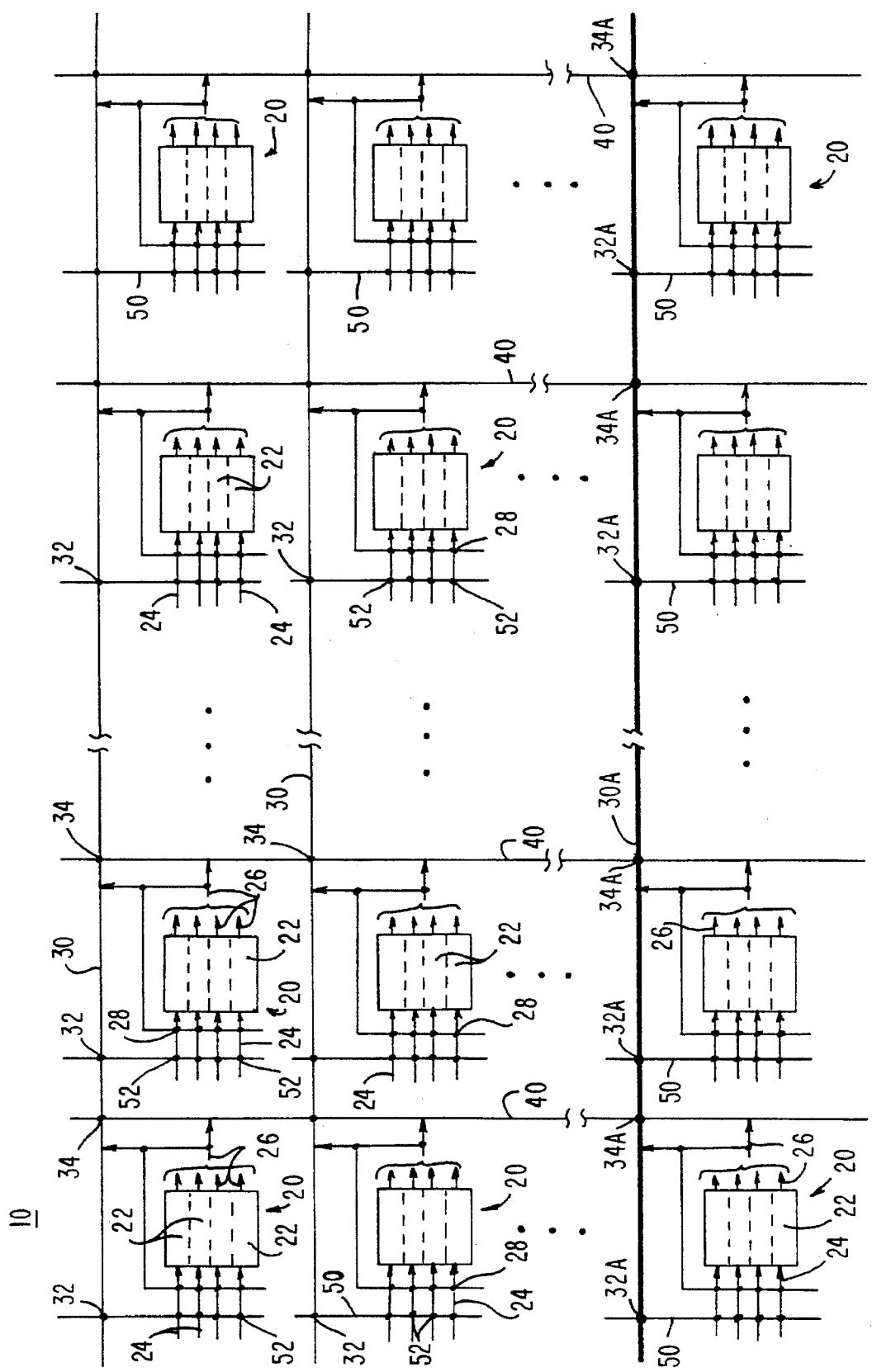
FIG. 1 is a schematic block diagram of a portion of a first illustrative embodiment of a programmable logic array integrated circuit device constructed in accordance with this invention.

An illustrative programmable logic array integrated circuit device 10 which can be constructed in accordance with the principles of this invention is shown in FIG. 1. Device 10 includes several horizontal rows and several vertical columns of regions 20 of programmable logic. Each region 20 is at the intersection of one row and one column. Although regions 20 may be constructed differently if desired, in the depicted embodiment each region 20 is made up of a plurality of modules 22 of programmable logic. Each module 22 receives several input signals via several associated input conductors 24. Each module 22 is programmable to perform any of several logic functions on the signals it receives. And each logic module 22 produces an output signal 26 indicative of the result of the logic function it has performed. Logic modules 22 can have any of a wide variety of configurations and can be implemented using any of a wide variety of technologies. For example, logic be erasable and reprogrammable. As another example, logic modules 22 can be implemented using product term logic, look up tables, or other similar logic.

Each row of logic regions 20 has an associated plurality of horizontal row conductors 30 adjacent to it. Each column of logic regions 20 has an associated plurality of vertical column conductors 40 adjacent to it. Row conductors 30 are usable to convey signals to, from, and/or between the regions 20 in the associated row. Column conductors 40 are usable to convey signals to or between the various rows and/or from the regions 20 in the associated column.

The output signals 26 of the logic modules 22 in each region 20 can be applied to certain ones of the conductors 30 and 40 associated with the row and column that include that region. The output signals 26 of the logic modules 22 in each region 20 are also fed back for possible connection to the input signal leads 24 of the logic modules in that region.

Each region 20 has an associated plurality of region feeding conductors 50 adjacent to it. Each region feeding conductor 50 is programmably connectable to any one of several of the row conductors 30 that are associated with the row that includes that region. These programmable connections are made via programmable logic connectors ("PLCs") which are represented in FIG. 1 by the dot 32 between each group of row conductors 30 and each group of region feeding conductors 50. Preferably, the programmable interconnection area represented by each dot 32 is only partially populated. This means that each region feeding conductor 50 is programmably connectable to only some of the conductors 30 that pass through that area. Similarly, each conductor 30 passing through a PLC area 32 is preferably connectable to only some of the region feeding conductors 50 extending from that area.

PLCs 32 (and other PLCs used throughout device 10) can be implemented in any of many different ways. For example, each PLC can be a relatively simple programmable connector such as a switch or a plurality of switches for connecting an input or any one of several inputs to an output. Or each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. The components of PLCs can be controlled by various, programmable, function control elements ("FCEs"), which are not separately shown in the drawings. (With certain PLC implementations (e.g., fuses and metal optional links) separate FCE devices are not required.) FCEs can also be implemented in any of several different ways. For example, FCEs can be SRAMS, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. Any of these various technologies can also be used for implementing various components of logic modules 22.

The input signal leads 24 of each logic region 20 are programmably connectable to the region feeding conductors 50 associated with that region via PLCs 52 (which may be similar to above-described PLCs 32). The input signal leads 24 of each region 20 are also programmably connectable to the outputs 26 of that region via PLCs 28 (which may again be similar to PLCs 32). PLC areas 28 and 52 may have a higher interconnection population density than PLC areas 32. Indeed, PLC areas 28 and 52 may be fully populated.

PLC areas 34 indicate that conductors 30 and 40 may be programmably interconnectable at or near their intersections. Like PLC areas 32, each PLC area 34 is preferably only partially populated with possible interconnections between the conductors 30 and 40 passing through that area.

Signals may be applied to device 10 or may exit from device 10 via input/output pins (not shown) on the device. For example, such pins may be located near the periphery of the device and may be selectively connectable to at least some of conductors 30 and 40.

In accordance with the principles of this invention one or more of the rows of logic regions 20 may have more conductors 30 associated with it than other rows have. In FIG. 1 a row with extra conductors 30 is the bottom row, and this is indicated by the suffix A (for augmented) on the reference number for the conductors 30 in that row. The line representing conductors 30A is also a heavier line than the lines representing other groups of conductors 30 to emphasize that conductor group 30A includes more conductors than the other groups 30. For example, the augmented bottom row may have about 20% to about 50% more conductors 30 than unaugmented rows. The provision of extra conductors 30 in the augmented row gives that row substantially more horizontal interconnection capability than the unaugmented rows have. Any portion of the user's logic which requires more than the normal amount of horizontal interconnection can be placed in a row with the augmented resource of that kind.

Because the number of conductors 30 is increased in the bottom row, the PLC areas 32 in that row are also enlarged. This is indicated by the suffix A (for augmented) on the reference numbers 32 associated with the bottom row in FIG. 1. This augmenting of PLC areas 32A preferably means that each region feeding conductor 50 passing through an area 32A is connectable to more conductors 30A than a region feeding conductor 50 passing through an unaugmented area 32. This is due, at least in part, to the presence of more conductors 30A passing through an area 32A. The interconnection population density may be the same in areas 32 and 32A.

Interconnection areas 34A (between column conductors 40 and row conductors 30A) may also be enlarged as compared to unaugmented areas 34 because in the augmented row there are more row conductors 30A for the column conductors to be connected to. Again, however, the interconnection population density in areas 34A may be the same as for areas 34.

Although FIG. 1 shows only one row with an increased number of row conductors 30, it will be understood that more than one such row can be provided if desired. For example, approximately 10% to 30% of the rows of device 10 may have augmented groups of row conductors like above-described group 30A.

Figure 2:
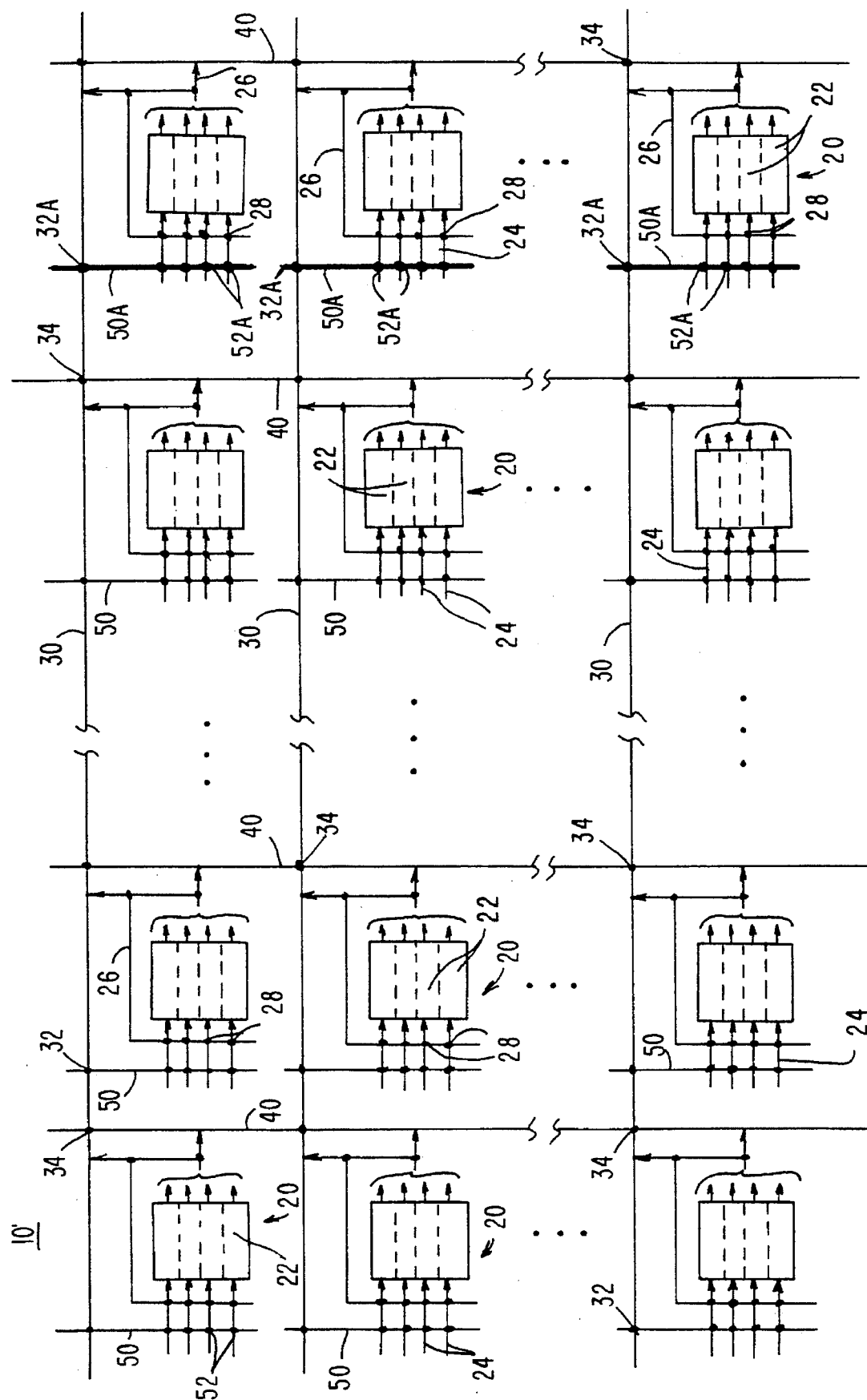
FIG. 2 is a schematic block diagram of a portion of a second illustrative embodiment of a programmable logic array integrated circuit device constructed in accordance with this invention.

An alternative embodiment of the invention is shown in FIG. 2. The device 10' of FIG. 2 is similar to device 10 except that device 10' does not have an augmented group of row conductors 30A. Instead, all groups of row conductors 30 in FIG. 2 are the same. The interconnection resources of device 10' are, however, augmented in the right-hand column by groups of region feeding conductors 50A that include more such conductors than the groups 50 in the other, unaugmented columns. The augmented groups 50A are emphasized by being drawn with heavier lines in FIG. 2. For example, augmented groups 50A may have approximately 20% to 75% more conductors than unaugmented groups 50.

Because of the larger number of conductors in augmented groups 50A, the PLC areas 32A and 52A associated with those groups are also increased in size as compared to unaugmented areas 32 and 52. The programmable interconnection population densities in areas 32A and 52A may be the same as in areas 32 and 52, but the increased number of connections in the larger areas 32A and 52A increases routing flexibility in those areas. Thus each row conductor 30 has more ways to get into a region 20 having augmented region feeding conductors 50A. Any portions of the user's logic that are input-intensive in this way are placed in the portions of device 10' that have augmented region feeding conductor groups 50A.

Regions 20 with augmented groups 50A of region feeding conductors can theoretically be placed anywhere on the device. However, with many device architectures such as the one shown in FIG. 2 it tends to be preferred to arrange the augmented groups 50A in columns. This helps keep each column of uniform width from the top to the bottom of the device, which tends to simplify and make more efficient the layout of the device.

Although device 10' is shown with only one column of regions 20 having augmented groups 50A of region feeding conductors, it will be understood that more than one such column can be provided if desired. For example, approximately 10% to 20% of regions 20 may have augmented groups 50A of region feeding conductors, which will mean that approximately 10% to 20% of the columns on the device may have such augmentation.

Figure 3:
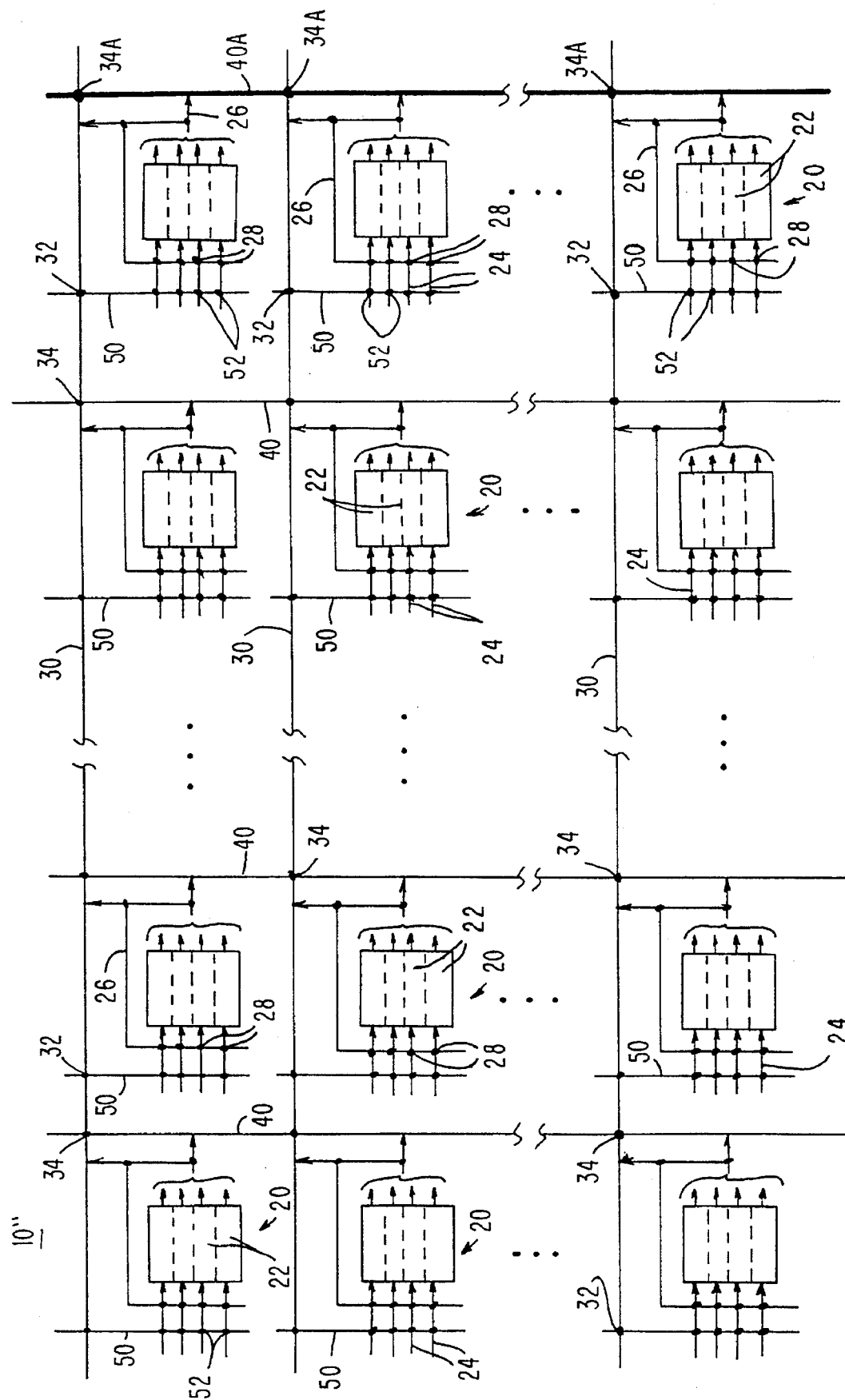
FIG. 3 is a schematic block diagram of a portion of a third illustrative embodiment of a programmable logic array integrated circuit device constructed in accordance with this invention.

FIG. 3 shows another alternative embodiment of the invention. Device 10" in FIG. 3 is again basically similar to devices 10 and 10', except that device 10" does not have augmented row conductors 30A or augmented region feeding conductors 50A. Instead, device 10" has a column of logic regions 20 with an augmented group 40A of column conductors. The line representing conductors 40A in FIG. 3 is heavier than the lines representing other groups of column conductors 40 to indicate that there are more conductors in group 40A than in the other groups. For example, group 40A may have approximately 20% to 75% more conductors than an unaugmented group 40. PLC areas 34A are also enlarged as compared to PLC areas 34 so that there are more PLCs available for making connections between augmented column conductor group 40A and each group of row conductors 30. The interconnection population density may be the same in areas 34A as in areas 34, but the number of available interconnections will be greater in areas 34A. The outputs 26 of each logic region 20 in the column having augmented column conductor group 40A may also be connectable to more column conductors than in other columns. For example, if each logic region output 26 is normally selectively connectable to two column conductors 40, and if group 40A has 50% more than the normal number of conductors, then each logic region output 26 associated with group 40A may be selectively connectable to three conductors in group 40A. Any portions of the user's logic which need more output routability of the kind that is augmented in device 10" are placed in the augmented right-hand column of device 10".

Although only one column in device 10" has an augmented group 40A of column conductors, it will be understood that more than one such column may be provided if desired. For example, approximately 10% to 20% of the columns on a device may be augmented in the manner shown for the right-hand column in FIG. 3.

It will be appreciated that the various different types of interconnection resource augmentation shown in FIGS. 1–3 can be combined in many different ways. For example, user logic which benefits from augmentation of the type shown in FIG. 2 may also tend to benefit from associated augmentation of the type shown in FIG. 3. In other words, one or more columns of a device may have both augmented region feeding conductors 50A and augmented column conductors 40A. Thus portions of the user's logic which have a greater than average demand for different inputs, and which may therefore also tend to produce more than the average number of separate outputs to be transmitted elsewhere in the logic, can be placed in the column(s) of the device having augmented region feeding conductors 50A and augmented column conductors 40A.

Figure 4:
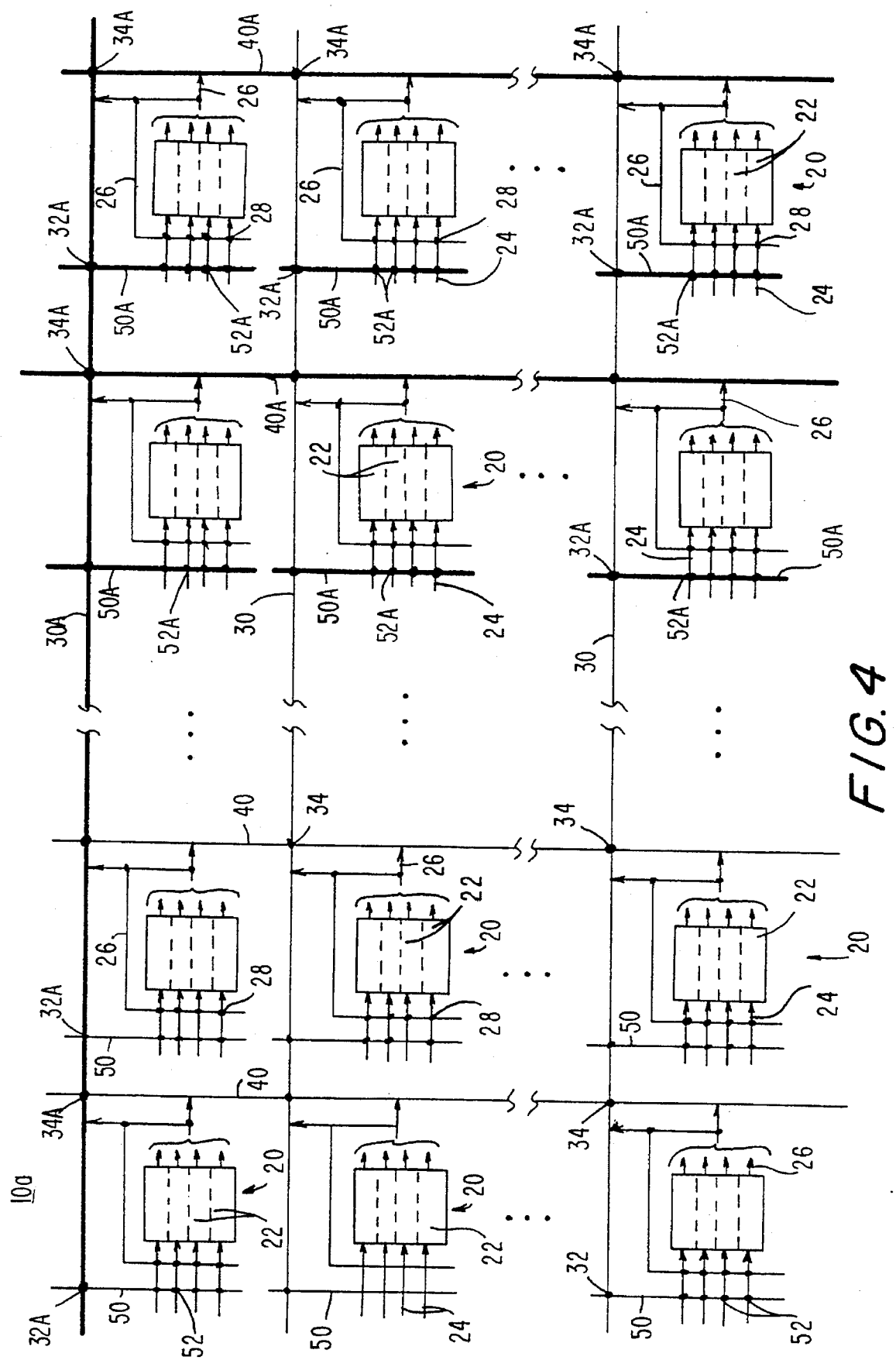
FIG. 4 is a schematic block diagram of a portion of a fourth illustrative embodiment of a programmable logic array integrated circuit device constructed in accordance with this invention.

FIG. 4 shows an alternative embodiment of the invention in which device 10a has one row with an augmented group of row conductors 30A and two columns with augmented region feeding conductor groups 50A and augmented column conductor groups 40A. Thus device 10a combines all of the various types of augmentation shown in FIGS. 1–3. Any portions of the user's logic that require more than the normal amount of interconnection resources are placed in the portions of device 10a which have appropriately augmented interconnection resources.

It should be noted that in the preferred embodiments logic regions 20 are the same or substantially the same whether or not they are associated with augmented interconnection resources. In other words, the logic regions associated with augmented interconnection resources are preferably not of a different kind or even of a different logic capability or capacity than logic regions that are not associated with augmented interconnections. A device within the scope of this invention may include other types of logic regions, but those are extraneous to this invention. For example, a device within the scope of this invention may include a column of regions of random access memory in addition to several columns of logic regions 20, but the random access memory column is irrelevant to and not part of the present invention. Only substantially similar logic regions 20 and the interconnection resources associated with those logic regions are relevant to preferred embodiments of this invention.

It will be understood that the foregoing is only illustrative of the principles of this invention, and that various modifications can be made by those skilled in the art without departing from the scope and spirit of the invention. For example, the number of rows and columns of logic regions 20 on a device can vary considerably, as can the number of rows and/or columns with augmented interconnection resources. The number of logic modules 22 in each region 20 can differ from the number shown in the drawings. The amount by which each type of interconnection resource is augmented can differ from the examples mentioned above. Some programmable logic array integrated circuit device have some interconnection conductors that span only a fraction (e.g., half) of the associated row or column. These shorter conductors can be augmented in the same way that the longer conductors are augmented in rows or columns in which there is augmentation. It will also be understood that the terms "row" and "column" as used herein are arbitrary and interchangeable, depending on how a particular device happens to be laid out. In other words, there is no special significance to the use of the term "row" or "column." A device having rows or columns like the "rows" described herein is within the scope of this invention. Similarly, a device having rows or columns like the "columns" described herein is also within the scope of this invention.

The invention claimed is:

1. A programmable logic array integrated circuit device comprising:
   a plurality of regions of programmable logic disposed on the device in a two-dimensional array of intersecting rows and columns of said regions;
   a plurality of row conductors associated with and extending along each of said rows for selectively conveying logic signals between regions in the associated row; and
   the plurality of row conductors associated with at least one of said rows being substantially greater in number than the pluralities of row conductors associated with at least some others of said rows.

2. The apparatus defined in claim 1 wherein said regions are substantially similar to one another.

3. The apparatus defined in claim 1 wherein the number of row conductors associated with said at least one of said rows is about 20% to about 50% greater than the number of row conductors associated with each of said at least some others of said rows.

4. The apparatus defined in claim 1 wherein approximately 10% to 30% of said rows have the number of associated row conductors that said at least one of said rows has associated with it.

5. The apparatus defined in claim 1 further comprising:
   a plurality of column conductors associated with and extending along each of said columns for selectively conveying logic signals between said rows.

6. The apparatus defined in claim 5 wherein the plurality of column conductors associated with at least one of said columns is substantially greater in number than the plurality of column conductors associated with at least some others of said columns.

7. The apparatus defined in claim 6 wherein the number of column conductors associated with said at least one of said columns is about 20% to about 50% greater than the number of column conductors associated with each of said at least some others of said columns.

8. The apparatus defined in claim 7 wherein approximately 10% to 20% of said columns have the number of associated column conductors that said at least one of said columns has associated with it.

9. The apparatus defined in claim 1 further comprising:
   a plurality of region feeding conductors associated with each of said regions for selectively bringing logic signals from the row conductors associated with the row that includes said region to said region for use in said region.

10. The apparatus defined in claim 9 wherein the plurality of region feeding conductors associated with at least one of said regions is substantially greater in number than the pluralities of region feeding conductors associated with at least some others of said regions.

11. The apparatus defined in claim 10 wherein the number of region feeding conductors associated with said at least one of said regions is approximately 20% to 75% greater than the number of region feeding conductors associated with each of said at least some others of said regions.

12. The apparatus defined in claim 11 wherein approximately 10% to 20% of said regions have the number of associated region feeding conductors that said at least one of said regions has associated with it.

13. The apparatus defined in claim 11 wherein substantially all of the regions in at least one of said columns have the number of region feeding conductors associated with them that said at least one of said regions has associated with it.

14. The apparatus defined in claim 13 further comprising:
   a plurality of column conductors associated with each of said columns for selectively conveying logic signals between said rows.

15. The apparatus defined in claim 14 wherein the plurality of column conductors associated with at least one of said columns is substantially greater in number than the pluralities of column conductors associated with at least some others of said columns.

16. The apparatus defined in claim 15 wherein the number of column conductors associated with said at least one of said columns is about 20% to about 75% greater than the number of column conductors associated with each of said at least some others of said columns.

17. A programmable logic array integrated circuit device comprising:
   a plurality of regions of programmable logic disposed on the device in a two-dimensional array of intersecting rows and columns of said regions;
   a plurality of row conductors associated with and extending along each of said rows for selectively conveying logic signals between regions in the associated row;
   a plurality of region feeding conductors associated with each of said regions for selectively bringing logic signals from the row conductors associated with the row that includes said region to said region for use in said region; and
   the plurality of region feeding conductors associated with at least one of said regions being substantially greater in number than the pluralities of region feeding conductors associated with at least some others of said regions.

18. The apparatus defined in claim 17 wherein the number of region feeding conductors associated with said at least one of said regions is approximately 20% to 75% greater than the number of region feeding conductors associated with each of said at least some others of said regions.

19. The apparatus defined in claim 18 wherein approximately 10% to 20% of said regions have the number of associated region feeding conductors that said at least one of said regions has associated with it.

20. The apparatus defined in claim 18 wherein substantially all of the regions in at least one of said columns have the number of region feeding conductors associated with them that said at least one of said regions has associated with it.

21. The apparatus defined in claim 20 further comprising:
a plurality of column conductors associated with each of said columns for selectively conveying logic signals between said rows.

22. The apparatus defined in claim 21 wherein the plurality of column conductors associated with at least one of said columns is substantially greater in number than the pluralities of column conductors associated with at least some others of said columns.

23. The apparatus defined in claim 22 wherein the number of column conductors associated with said at least one of said columns is about 20% to about 75% greater than the number of column conductors associated with each of said at least some others of said columns.

24. A programmable logic array integrated circuit device comprising:

a plurality of regions of programmable logic disposed on the device in a two-dimensional array of intersecting rows and columns of said regions;

a plurality of row conductors associated with and extending along each of said rows for selectively conveying logic signals between regions in the associated row;

a plurality of column conductors associated with and extending along each of said columns for selectively conveying logic signals between said rows; and the plurality of column conductors associated with at least one of said columns being substantially greater in number than the pluralities of column conductors associated with at least some others of said columns.

25. The apparatus defined in claim 24 wherein the number of column conductors associated with said at least one of said columns is about 20% to about 75% greater than the number of column conductors associated with each of said at least some others of said columns.

26. The apparatus defined in claim 25 wherein approximately 10% to 20% of said columns have the number of associated column conductors that said at least one of said columns has associated with it.

* * * * *